(12) United States Patent
McGlaughlin et al.

(10) Patent No.: US 10,922,221 B2
(45) Date of Patent: Feb. 16, 2021

(54) MEMORY MANAGEMENT

(71) Applicant: Micron Technology, Inc., Boise, ID (US)

(72) Inventors: Edward C. McGlaughlin, Minneapolis, MN (US); Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 352 days.

(21) Appl. No.: 15/938,977

(22) Filed: Mar. 28, 2018

(65) Prior Publication Data
US 2019/0303283 A1 Oct. 3, 2019

(51) Int. Cl.
| | |
|---|---|
| *G06F 12/02* | (2006.01) |
| *G06F 3/06* | (2006.01) |
| *G11C 16/26* | (2006.01) |
| *G11C 16/10* | (2006.01) |
| *G11C 16/34* | (2006.01) |
| *G11C 29/52* | (2006.01) |

(52) U.S. Cl.
CPC ........ *G06F 12/0246* (2013.01); *G06F 3/0679* (2013.01); *G11C 16/10* (2013.01); *G11C 16/26* (2013.01); *G11C 16/349* (2013.01); *G11C 16/3427* (2013.01); *G11C 29/52* (2013.01); *G06F 2212/7201* (2013.01); *G06F 2212/7211* (2013.01)

(58) Field of Classification Search
None
See application file for complete search history.

(56) References Cited

U.S. PATENT DOCUMENTS

| | | |
|---|---|---|
| 7,917,689 B2 | 3/2011 | Rothman et al. |
| 8,055,836 B2 | 11/2011 | Kim et al. |
| 8,209,468 B2 | 6/2012 | Lee |
| 8,671,239 B2 | 3/2014 | Yang et al. |
| 8,745,315 B2 | 6/2014 | Ware et al. |
| 8,819,358 B2 | 8/2014 | Ye et al. |
| 8,990,483 B2 | 3/2015 | Kwak |
| 9,069,661 B2 | 6/2015 | Van Aken |
| 9,208,070 B2 | 12/2015 | D'Abreu et al. |
| 9,372,790 B2 | 6/2016 | Lee et al. |

(Continued)

*Primary Examiner* — Sean D Rossiter
*Assistant Examiner* — Stephanie Wu
(74) *Attorney, Agent, or Firm* — Brooks, Cameron & Huebsch, PLLC

(57) ABSTRACT

An example method includes maintaining a first data structure comprising logical address to physical address mappings for managed units corresponding to a memory, and maintaining a second data structure whose entries correspond to respective physical managed unit addresses. Each entry of the second data structure comprises an activity counter field corresponding to the respective physical managed unit address and a number of additional fields indicating whether the respective physical managed unit address is in one or more of a number of additional data structures. The one or more additional data structures are accessed in association with performing at least one of a wear leveling operation on the respective physical managed unit address, and a neighbor disturb mitigation operation on physical managed unit addresses corresponding to neighbors of the respective physical managed unit address.

21 Claims, 11 Drawing Sheets

(56) References Cited

U.S. PATENT DOCUMENTS

| | | | |
|---|---|---|---|
| 9,785,550 B1 | 10/2017 | Kim et al. | |
| 9,892,033 B1* | 2/2018 | Sabbag | G06F 12/0246 |
| 10,474,370 B1* | 11/2019 | Van Gaasbeck | G06F 3/0659 |
| 2007/0220195 A1* | 9/2007 | Kawaguchi | G06F 12/0284 |
| | | | 711/5 |
| 2008/0301256 A1* | 12/2008 | McWilliams | G06F 12/0802 |
| | | | 709/214 |
| 2013/0159766 A1* | 6/2013 | D'Abreu | G06F 12/0246 |
| | | | 714/6.3 |
| 2014/0173239 A1* | 6/2014 | Schushan | G11C 16/349 |
| | | | 711/165 |
| 2015/0131376 A1* | 5/2015 | Tsang | G11C 16/3404 |
| | | | 365/185.03 |
| 2015/0213877 A1* | 7/2015 | Darel | G11C 7/1072 |
| | | | 711/106 |
| 2015/0301843 A1* | 10/2015 | Guo | G06F 9/45558 |
| | | | 718/1 |
| 2015/0347013 A1* | 12/2015 | Mathur | G06F 12/0871 |
| | | | 711/103 |
| 2016/0055910 A1* | 2/2016 | Tuers | G11C 16/3418 |
| | | | 365/185.03 |
| 2016/0118132 A1* | 4/2016 | Prins | G11C 16/3431 |
| | | | 714/704 |
| 2017/0371559 A1* | 12/2017 | Higgins | G06F 3/0673 |
| 2018/0253347 A1* | 9/2018 | Shigeta | G06F 11/08 |
| 2018/0267706 A1* | 9/2018 | Li | G06F 3/0685 |
| 2019/0171387 A1* | 6/2019 | Willhalm | G06F 12/0246 |
| 2019/0221273 A1* | 7/2019 | Parkinson | G06F 3/0611 |
| 2020/0026643 A1* | 1/2020 | Tai | G06F 12/0215 |
| 2020/0050541 A1* | 2/2020 | Johannes de Jong | G06F 11/076 |
| 2020/0081828 A1* | 3/2020 | Chen | G06F 3/061 |
| 2020/0105354 A1* | 4/2020 | Helmick | G06F 12/0238 |
| 2020/0110544 A1* | 4/2020 | Zhu | G06F 3/0647 |

* cited by examiner

MEMORY MANAGEMENT

TECHNICAL FIELD

The present disclosure relates generally to memory and methods, and more particularly, to memory management.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), three dimensional cross point memory, resistive random access memory (RRAM), magnetic random access memory (MRAM), and programmable conductive memory, among others.

Memory cells are often arranged in an array architecture and are programmable to a number of different data states corresponding to one or more data units (e.g., bits). Management of different memory types can vary widely based on their different characteristics such as whether the cells are being used as a cache memory, main memory, or storage memory, whether the cells are volatile or non-volatile, whether the cell is subject to wear and to what extent the memory cells degrade over time, how prone the memory cells are to being disturbed due to accesses to neighboring cells, and/or whether the cells can be rewritten without first being erased, among various other factors.

DETAILED DESCRIPTION

Aspects of the present disclosure are directed to apparatuses and methods for memory management. Various embodiments provide technological advantages such as improved handling of neighbor disturb and/or wear leveling as compared to prior approaches. As an example, for storage systems (e.g., solid state drives) employing logical to physical address mapping, embodiments of the present disclosure can utilize various updatable data structures (e.g., tables, lists, etc.) adaptable based on various characteristics of the system. For instance, various embodiments provide improved adaptability to different workloads and/or changes to wear endurance and neighbor disturb effects, which can vary over time, as compared to previous memory management techniques. Embodiments can provide remapping of managed units to reduce wear and/or neighbor disturb effects while providing reduced data movements associated with data overwrites and/or rewrites as compared to memory types such as NAND flash memory, for example.

In NAND flash memory, such data movements can occur as part of host writes or as part of a garbage collection process, which can occupy system resources and/or can lead to increased write amplification. For instance, various NAND flash memory management schemes require updates to a logical address to physical address mapping table (e.g., L2P table) subsequent to each write operation performed on the memory. In contrast, a number of embodiments of the present disclosure can require updates to the L2P table only responsive to particular events, such as writes resulting in a swap operation between "hot" and "cold" managed units, for example. Reducing the frequency and/or quantity of updates to memory management data structures such as L2P table can reduce management overhead and write amplification, among other benefits. Unlike NAND flash memory, which requires erasure prior to being overwritten, embodiments of the present disclosure can include write in place memory, in which multiple writes to cells mapped by a particular logical address can performed without having to change the physical address to which the particular logical address maps. As described further herein, managing memory in accordance with embodiments described herein can increase the useful lifetime of a system by effectively and efficiently handling wear leveling and/or neighbor disturb effects, which can reduce the bit error rate of the memory as the system ages, among various other benefits.

Figure 1:
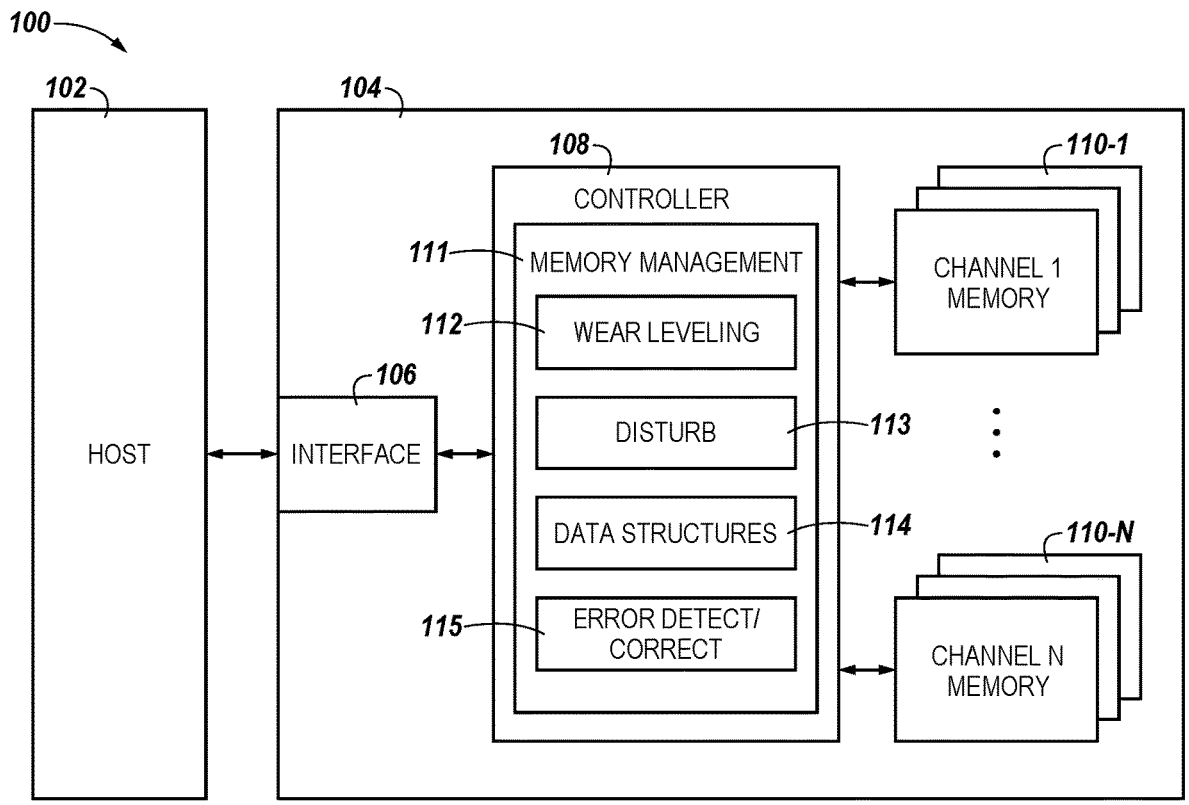
FIG. 1 illustrates a block diagram of an apparatus in the form of a computing system configured to perform memory management in accordance with a number of embodiments of the present disclosure.

FIG. 1 illustrates a block diagram of an apparatus in the form of a computing system 100 configured to perform memory management in accordance with a number of embodiments of the present disclosure. As used herein, an "apparatus" can refer to, but is not limited to, a variety of structures or combinations of structures. For instance, memory system 104, controller 108, and memory devices 110-1 to 110-N might separately be considered an "apparatus".

The memory system 104 can be, for example, a storage system such as a solid state drive (SSD), and can include an interface 106, a controller 108 (e.g., a processor and/or other control circuitry), and a number of memory devices 110-1, . . . , 110-N, which may be referred to collectively as memory devices 110. The memory devices 110 can provide a storage volume for the memory system 104; however, one or more of the memory devices 110 may function as main memory for system 100. In a number of embodiments, the memory system 104 is a hybrid memory/storage system.

As illustrated in FIG. 1, memory system 104 can be coupled to a host 102 via interface 106. Host 102 can be a host system such as a personal laptop computer, a desktop computer, a digital camera, a mobile device (e.g., cellular phone), network server, Internet of Things (IoT) enabled device, or a memory card reader, among various other types of hosts. Host 102 can include a number of memory access devices (e.g., a number of processors) capable of accessing memory devices 110 (e.g., via controller 108).

In the example illustrated in FIG. 1, the controller 108 is coupled to the memory devices 110 via multiple channels (e.g., CHANNEL 1 MEMORY, . . . , CHANNEL N MEMORY) and can be used to transfer data between the memory system 104 and host 102 (e.g., via interface 106). The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

The controller 108 can communicate with the memory devices 110 to control data read, write, and erase operations, among other operations. Although not specifically illustrated, in some embodiments, the controller 108 can include a discrete memory channel controller for each channel coupling the controller 108 to the memory devices 110. The controller 108 can include, for example, a number of components in the form of hardware (e.g., one or more integrated circuits) and/or software (e.g., instructions, which may be in the form of firmware) for controlling access to the number of memory devices 110 and/or for facilitating data transfer between the host 102 and memory devices 110. In general, the controller 108 can receive commands (e.g., operations) from the host 102 and can convert the commands into instructions or appropriate commands to achieve the desired access to the memory devices 110.

As described further herein, the controller 108 can be responsible for, among other operations, memory management operations such as wear leveling operations, error detection and/or correction operations, disturb mitigation operations, encryption operations, caching operations, and address translation operations, among various other operations associated with the memory devices 110. The controller can perform memory management in association with performing background operations and/or foreground operations. Foreground operations can include operations initiated by a host (e.g., host 102) such read and/or write access commands. Background operations can include operations which are initiated by a controller (e.g., 108) and/or whose execution can be transparent to the host (e.g., host 102), such as various wear leveling operations and/or neighbor disturb mitigation operations performed in accordance with embodiments of the present disclosure.

The memory devices 110 can include a number of arrays of memory cells. The memory devices 110 can include two-dimensional (2D) and/or three-dimensional (3D) array structures such as cross point array structures. An example of a memory device structure is described further below in association with FIG. 10 and FIG. 11. The memory cells can include, for example, various types of cells having a resistance variable storage element and/or switch element (e.g., PCRAM cells, RRAM cells. As used herein, a storage element refers to a programmable portion of a memory cell. For instance, the memory devices 110 can be 3D cross point devices whose cells can include a "stack" structure in which a storage element is coupled in series with a switch element and which can be referred to herein as a 3D phase change material and switch (PCMS) device. 3D PCMS cells can include, for example, a two-terminal chalcogenide based storage element coupled in series with a two-terminal chalcogenide based switch element such as an ovonic threshold switch (OTS). In a number of embodiments, the memory cells can be self-selecting memory (SSM) cells in which a single material can serve as both the storage element and the memory element. An SSM cell can include a chalcogenide alloy; however, embodiments are not so limited.

As non-limiting examples, the memory cells of memory devices 110 can include a phase change material (e.g., phase change chalcogenide alloy) such as an indium(In)-antimony (Sb)-tellurium(Te) (IST) material (e.g., $In_2Sb_2Te_5$, $In_1Sb_2Te_4$, $In_1Sb_4Te_7$, etc.) or a germanium (Ge)-antimony (Sb)-tellurium (Te) (GST) material (e.g., $Ge_2Sb_2Te_5$, $Ge_1Sb_2Te_4$, $Ge_1Sb_4Te_7$, etc.). The hyphenated chemical composition notation, as used herein, indicates the elements included in a particular mixture or compound, and is intended to represent all stoichiometries involving the indicated elements. Other memory cell materials can include GeTe, In—Se, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other materials.

As shown in FIG. 1, the controller 108 includes a memory management component 111 configured to perform various memory management operations in accordance with embodiments described herein. In this example, the memory management component 111 includes a wear leveling component 112, a neighbor disturb mitigation component 113, and an error detection/correction component 115 (e.g., an error correction code (ECC) engine). The memory management component 111 also includes a number of data structures 114. As used herein, a "data structure" refers to a format for organizing and/or storing data, examples of which include tables, arrays, files, lists records, queues, trees, etc.

As described further below, the data structures 114 can include a logical to physical (L2P) address mapping data structure (e.g., table) for mapping logical managed unit (MUA) addresses to physical managed units (PMUs) stored in memory 110, a physical managed unit address (PMUA) table, a disturb list, a hot list, a cold list, and a quarantine list. In is noted that the terms "table" and "list" used to describe the particular data structures 114 are intended only as non-limiting examples.

The various components 112, 113, 114, and 115 of memory management component 111 can be discrete components such as application specific integrated circuit (ASICs) or the components may reflect functionally provided by circuitry within the controller 108 that does not necessarily have a discrete physical form separate from other portions of the controller 108. Although illustrated as components within the memory management component 111 in FIG. 1, each of the components 112, 113, 114, and 115, or portions thereof, can be external to the memory management component 111 and/or external to the controller 108. For example, the error detection/correction component 115 can include a number of error correction coding circuits located on the controller 108 and a number of error correction coding circuits located external to the controller 108.

Figure 2:
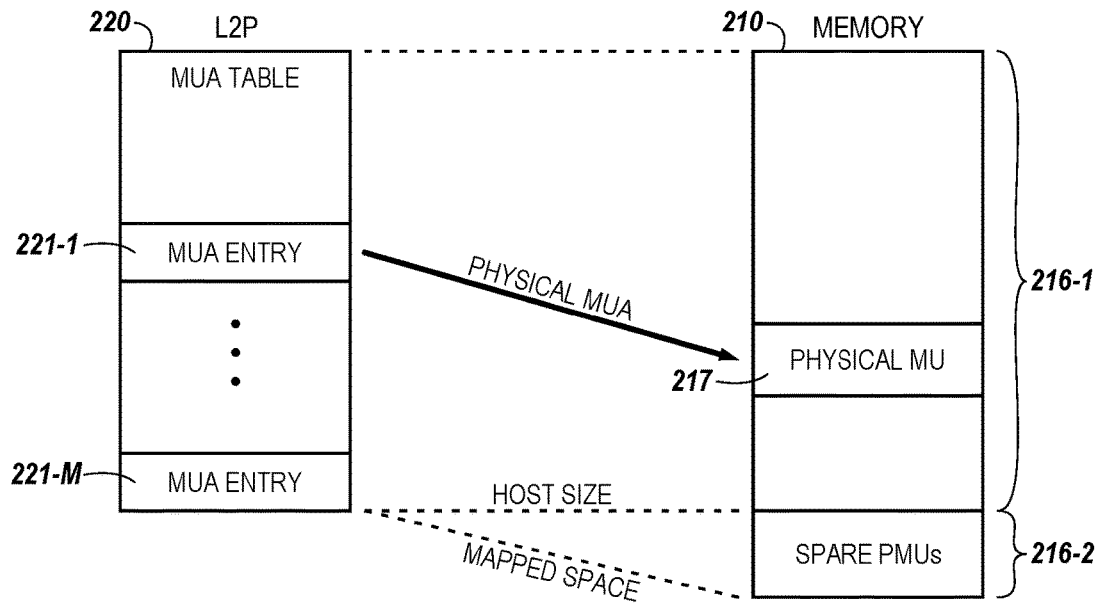
FIG. 2 illustrates an example of logical address to physical address mapping in associated with performing memory management in accordance with a number of embodiments of the present disclosure.

FIG. 2 illustrates an example of logical address to physical address mapping in associated with performing memory management in accordance with a number of embodiments of the present disclosure. In FIG. 2, MUA table 220 represents a L2P data structure associated with mapping a physical memory 210. The table 220 can be one of the data structures 114 maintained by a controller such as controller 108, and the memory 210 can represent a memory such as memory 110 shown in FIG. 1.

In operation, a host (e.g., host 102) often uses logical addressing (e.g., logical block addressing) for identifying logical regions (e.g., sectors) of data. As an example, a logical address can correspond to 256 bytes, 512 bytes, 1,024 bytes, etc. The logical addresses (e.g., logical block addresses (LBAs)) can be organized by a controller (e.g., controller 108) into managed units (MUs), which can refer to a unit (e.g., size) of memory managed by the controller (e.g., via an L2P table). As an example, a logical MUA can correspond to multiple host LBAs such that a MU can correspond to 2 KB, 4 KB, 8 KB, etc. The size of a MU can also correlate to a write and/or read size associated with the memory being mapped (e.g., memory 210). For example, the MU size can be a multiple of a physical page size of the memory, a multiple of a codeword size associated with the memory, etc.

As shown in FIG. 2, the entries 221-1 to 221-M of table 220 can be indexed by logical MUAs, with each entry including a PMUA which indicates (e.g., points to) the location of a corresponding PMU 217 on memory 210. For example, as shown in FIG. 2, MUA entry 221-1 points to a particular PMU 217. In a number of embodiments, the data stored in the cells corresponding to a PMU 217 can include user data and/or parity data as well as various metadata, which can include the LMUA currently mapping to the PMUA corresponding to the PMU 217.

In operation, the size of the logical space mapped by table 220 can be less than the physical space of memory 220. For instance, as shown in FIG. 2, the capacity of memory 210 includes a first portion 216-1 and a second portion 216-2. In this example, the portion 216-1 represents the amount of memory 210 mapped by table 220, and the portion 216-2 represents an additional amount of memory 210 that includes spare PMUs, which may be used in association with memory management as described further herein.

Figure 3:
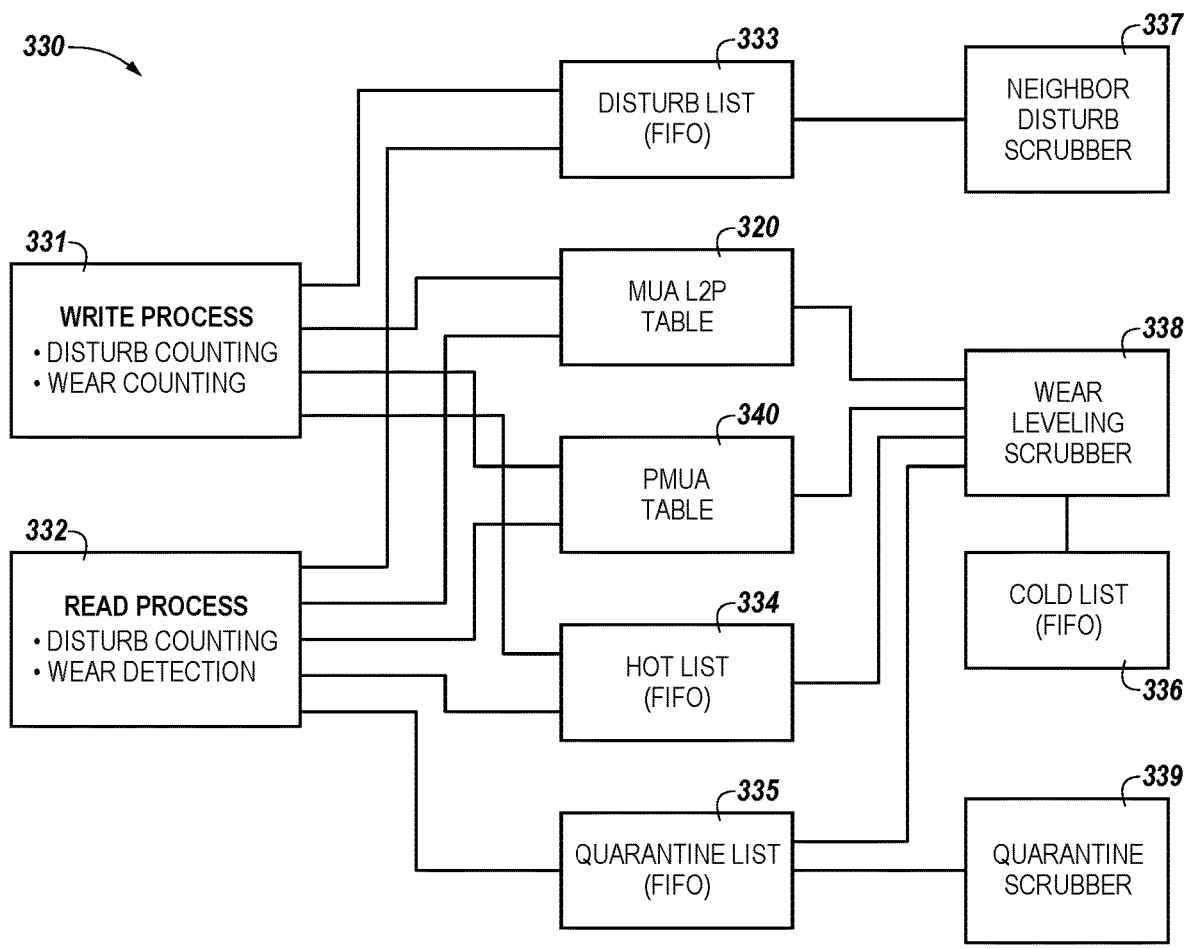
FIG. 3 is a block diagram illustrating a number of data structures and processes associated with performing memory management in accordance with a number of embodiments of the present disclosure.
Figure 5:
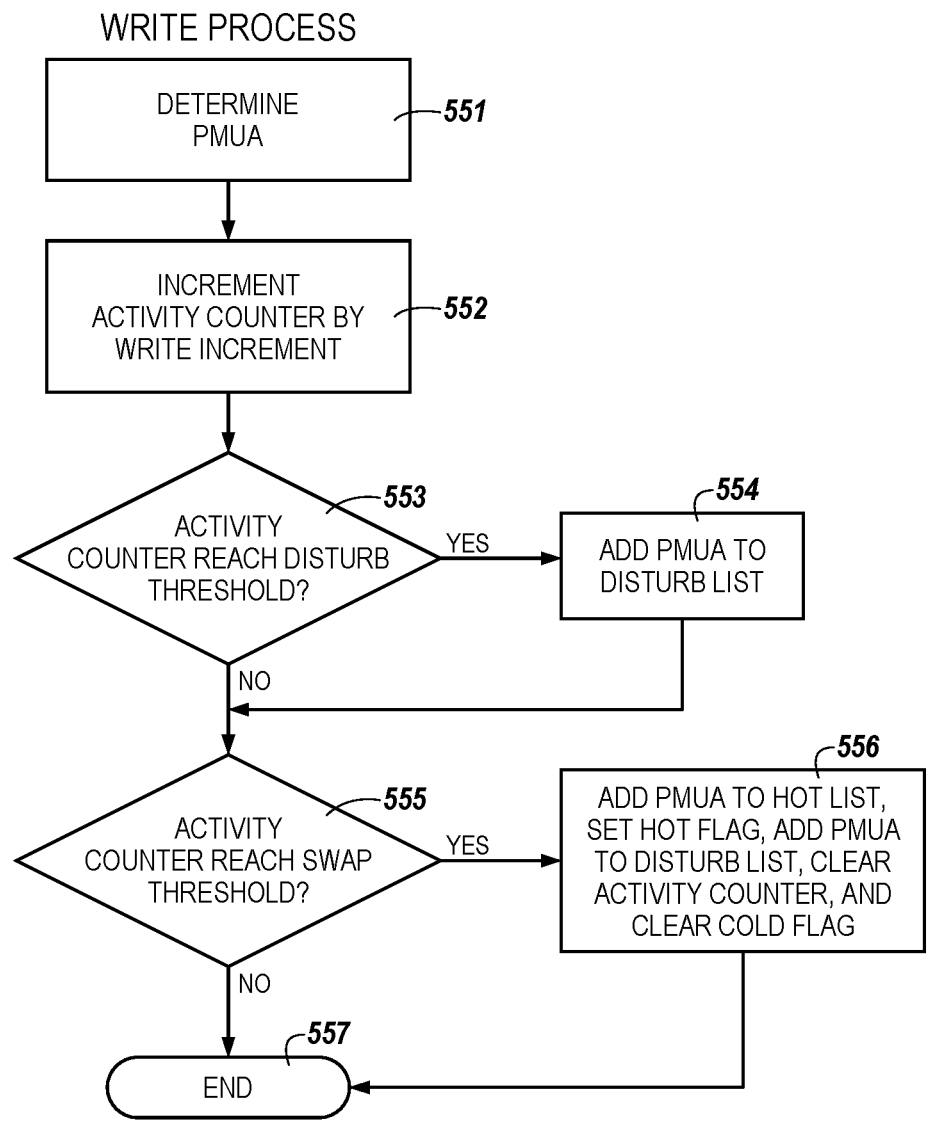
FIG. 5 is a flow diagram illustrating an example write process associated with performing memory management in accordance with a number of embodiments of the present disclosure.
Figure 6:
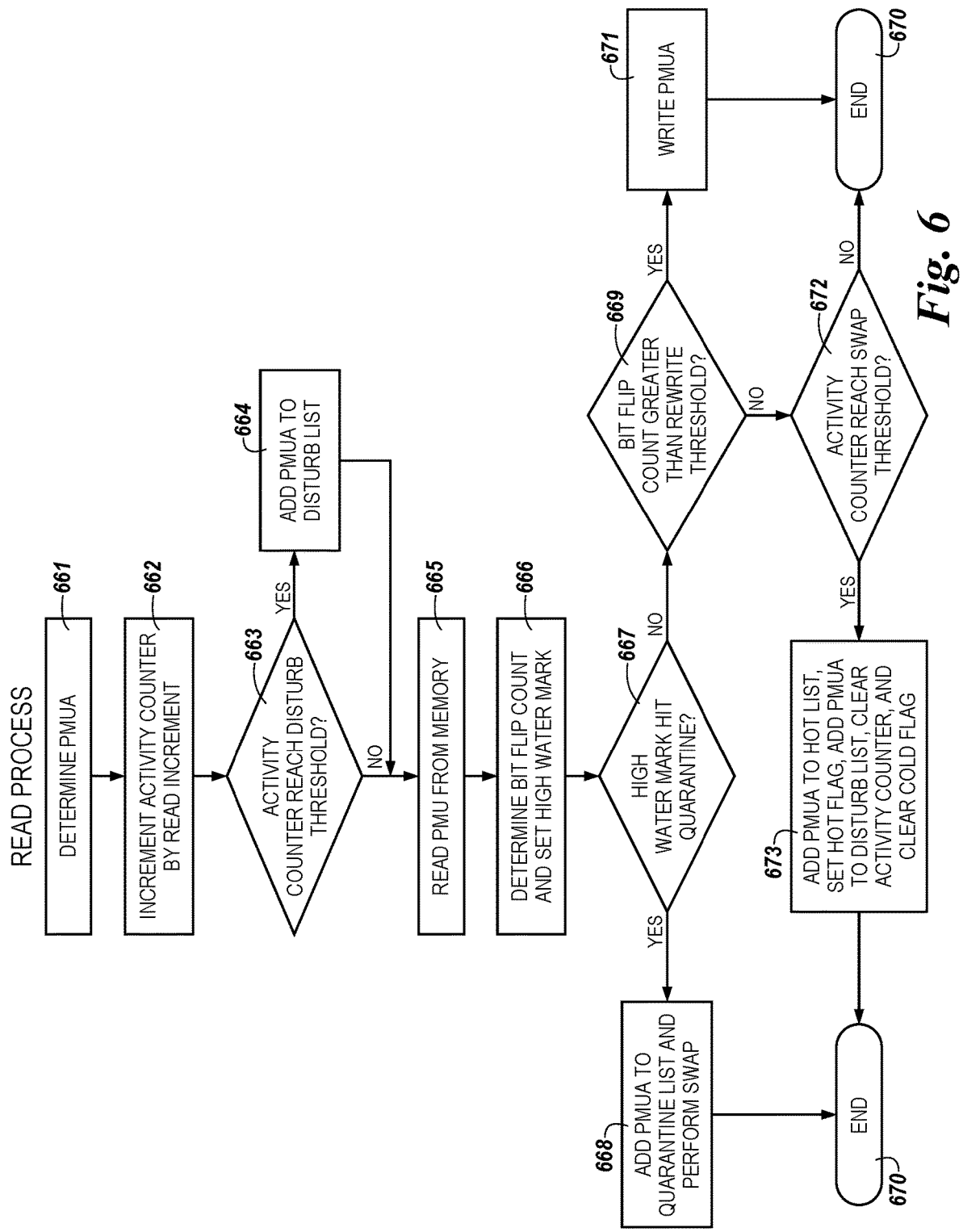
FIG. 6 is a flow diagram illustrating an example read process associated with performing memory management in accordance with a number of embodiments of the present disclosure.

FIG. 3 is a block diagram 330 illustrating a number of data structures and processes associated with performing memory management in accordance with a number of embodiments of the present disclosure. The data structures illustrated in FIG. 3 include a MUA L2P table 320 (e.g., table 220 shown in FIG. 2), a PMUA table 340, a disturb list 333, a hot list 334, a quarantine list 335, and cold list 336. In FIG. 3, block 331 represents a write process and block 332 represents a read process. Accordingly, block 331 may be referred to as write process 331 and block 332 may be referred to as read process 332. The processes 331 and 332 can be performed by a system such as computing system 100 shown in FIG. 1 and/or computing system 1201 shown in FIG. 12. As an example, the processes 331 and 332 can be foreground processes corresponding to respective host write requests and host read requests. As described further below, performing processes 331 and 332 can involve accessing and/or updating the various data structures 320, 340, 333, 334, 335, and/or 336 in association with performing wear leveling and/or neighbor disturb mitigation in accordance with various embodiments of the present disclosure. For instance, the write process 331 and/or read process 332 can involve accessing a PMUA table 340 and taking particular actions based on whether the value of an activity counter field of the corresponding entry has reached one or more threshold levels. An example write process 331 is illustrated in FIG. 5 and an example read process 332 is illustrated in FIG. 6.

Block 337 represents a neighbor disturb mitigation process, block 338 represents a wear leveling process, and block 339 represents a quarantine process. Accordingly, block 337 may be referred to as neighbor disturb scrubber 337, block 338 may be referred to as wear leveling scrubber 338, and block 339 may be referred to as quarantine scrubber 339. Although embodiments are not so limited, as described further below, the processes 337, 338, and/or 339 can be performed as background processes (e.g., during idle time of the system), which can provide benefits such as preventing the processes from reducing the quantity and/or speed at which host access requests are serviced, among various other benefits. The neighbor disturb scrubber 337 can be responsible for performing reads of neighbors of PMUAs determined to be aggressors and can perform conditional re-writes of the neighbors based on various factors. The wear leveling scrubber 338 can be responsible for functions such as performing data location swaps (e.g., between hot list 334 and cold list 336 entries). The quarantine scrubber 339 can be responsible for evaluating PMUAs in the quarantine list 335 to determine whether to retire the PMUAs (e.g., from further use). Example processes 338, 337, and 339 in accordance with embodiments of the present disclosure are described further below in FIG. 7, FIG. 8, and FIG. 9, respectively.

The MUA L2P table 320 can be managed by a controller such as controller 108 and its entries can be indexed according to logical MUAs with each entry indicating a PMUA associated with a memory such as memory 110. In a number of embodiments, the table 320 can be initialized for direct mapping (e.g., LMUA=PMUA) and can be updated for indirect mapping as wear leveling "swaps" are performed. As shown in FIG. 2, the memory mapped by table 320 can include spare PMUAs, which can be used, for example, to replace bad PMUs on the memory and/or for wear leveling purposes as described further herein.

As described further below in association with FIG. 4A and FIG. 4B, the PMUA table 340 can be indexed by the PMUAs corresponding to the memory mapped by the MUA L2P table 320. The entries of table 340 include various information used to perform memory management in accordance with embodiments described herein. For example, each entry of table 340 can include an activity counter field that can be updated (e.g., incremented) responsive to reads and writes performed on the corresponding PMUA. The value of the activity counter field, which can be referred to as the activity count, can be incremented by different amounts for reads and writes. The value of the activity counter field can provide an indication of the amount of wear experienced by a particular PMUA and/or an indication of an amount of disturb experienced by neighboring PMUAs, among other information.

The entries of table 340 can also include a number of additional fields, which may be in the form of one or more flag bits, that can indicate different attributes of the corresponding PMUA. For instance, a number of flags can be used to indicate whether the corresponding flag is presently in another of the memory management data structures maintained by the controller. For instance, an entry in table 340 can include respective flags indicating whether the corresponding PMUA is currently in list 333, list 334, list 335, and/or list 336. Other fields in table 340 entries can include a field indicating a bit flip "high water mark," which can indicate an uppermost quantity of determined bit flips responsive to a read of the corresponding PMUA. As described further below, a quarantine flag within a particular entry of table 340 can be set responsive to the bit flip high-water mark reaching a threshold value.

The disturb list 333 can include those PMUAs determined to have reached a disturb threshold, which can be based on activity counts corresponding to respective PMUAs. The hot list 334 can include those PMUAs whose corresponding LMUAs are flagged as needing to be remapped to PMUAs having lower corresponding activity counts (e.g., via a swap operation). The cold list 336 can include those PMUAs which are candidates for swapping with PMUAs on the hot list 334. The quarantine list 335 can include those PMUAs to be evaluated for retirement (e.g., via quarantine scrubber 339) and which, upon being added to the list 335, can be subject to a high priority swap operation. The lists 333, 334, 335, and 336 may each be implemented as a first-in-first-out (FIFO) queue; however, embodiments are not so limited.

Figure 4A:
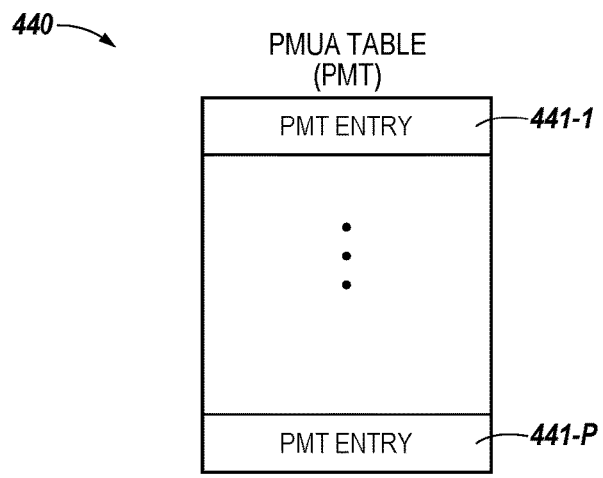
FIG. 4A illustrates an example physical managed unit address data structure used to perform memory management in accordance with a number of embodiments of the present disclosure.

FIG. 4A illustrates an example PMUA table (PMT) 440 used to perform memory management in accordance with a number of embodiments of the present disclosure. The table 440 can be analogous to table 340 shown in FIG. 3. The table 440 can be indexed by PMUAs of a memory such as memory 110 such that the entries 441-1 to 441-P correspond to respective PMUAs. The PMT entries can be referred to collectively as entries 441. FIG. 4B illustrates an example entry 441 from PMT 440. As shown in FIG. 4B, each entry 441 can include an activity counter field 443 corresponding to a particular PMUA. In operation, the value of the activity counter field 443 can be incremented responsive to each write to and read from the corresponding PMUA. In various embodiments, the activity counter can be incremented by different amounts for reads versus writes to the PMUA. As an example, the activity counter 443 can be incremented by one responsive to reads of the PMUA and by two or more for writes to the PMUA. The difference in increments to the counter 443 due to reads and writes can depend on various factors such as the type of memory and/or its particular characteristics. For instance, some types of memory can be more or less prone to wear (e.g., physical degradation) due to memory accesses. Also, some types of memory can be more or less prone to experiencing neighbor disturb effects due to reads and/or writes. Providing different activity counter increment amounts for reads and writes can be beneficial by accounting for different wear amounts that can occur due to reads versus writes, for example.

Figure 4B:
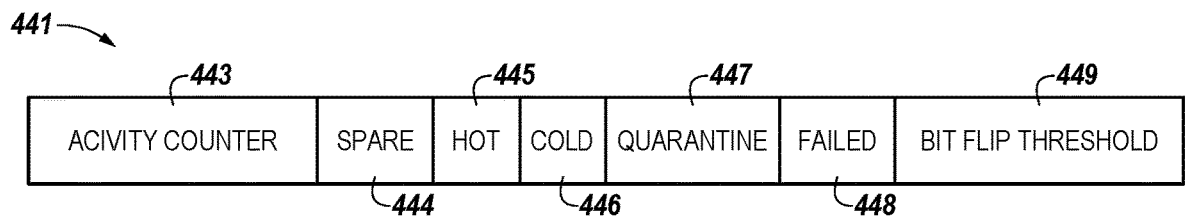
FIG. 4B illustrates an example entry from the physical managed unit address data structure shown in FIG. 4A.

As shown in FIG. 4B, each entry 441 can also include a number of additional fields, which, in conjunction with the activity counter field, are associated with performing memory management in accordance with embodiments described herein. Field 444 can be used to indicate whether the corresponding PMUA is one of a group of spare PMUAs (e.g., a spare PMU 217 associated with portion 216-2 of memory 210). Fields 445 and 446 can represent flags used to indicate relative activity counts corresponding to a PMUA. For example, field 445 can be a "hot" flag which, when set, can indicate a relatively high activity count (e.g., a count above a particular threshold), and field 446 can be a "cold" flag which, when set, can indicate a relatively low activity count (e.g., a count below a particular threshold).

Field 447 can be, for example, a flag which can be set responsive to a bit flip count corresponding to the PMUA reaching a threshold value. For example, the quarantine flag 447 being set can indicate that the corresponding PMUA is a candidate for swapping with a different PMUA and may need to be retired from use. Field 448 can be a flag which can be set to indicate that the corresponding PMUA is a "failed" PMUA (e.g., retired from use). In a number of embodiments, the flags (e.g., 445, 446, and 447) can be set in order to indicate the presence of the corresponding PMUA in one or more other data structures associated with performing memory management operations. For example, flag 445 being set can indicate the presence of the corresponding PMUA in a list such as hot list 334, flag 446 being set can indicate the presence of the corresponding PMUA in a list such as cold list 336, and flag 447 being set can indicate the presence of the corresponding PMUA in a list such as quarantine list 335.

Field 449 can be used to indicate a bit flip threshold level referred to as a bit flip "high water mark." For example, the value of field 449 can correspond to an uppermost quantity of determined bit flips responsive to a read of the corresponding PMUA. As used herein, a "bit flip" refers to a bit value determined to be erroneous (e.g., a stored logic "1" is read as a "0" or vice versa). For instance, a read of a PMUA may result in a determination that six bits are erroneous (e.g., a bit flip count of six). Field 449 can be multiple bits whose value is adjusted responsive to a respective number of different bit flip threshold determinations. For instance, a least significant bit of field 449 may be set responsive to a first bit flip threshold determination (e.g., 10 bit flips), a next more significant bit of field 449 may be set responsive to a second bit flip threshold determination (e.g., 100 bit flips), etc. In operation, the quarantine flag 447 may be set responsive to the value of field 449 reaching a particular value.

FIG. 5 is a flow diagram illustrating an example write process associated with performing memory management in accordance with a number of embodiments of the present disclosure. The write process described in FIG. 5 can be performed by, for example, a controller such as controller 108 shown in FIG. 1. The write process can be, for example, write process 331 shown in FIG. 3, and can be performed responsive to a received write request (e.g., a host write request from a host such as host 102). At block 551, the write process includes determining a PMUA to which data corresponding to the write request is to be written. Determining the PMUA can include accessing a L2P table such as MUA table 220 or 320. For example, the write request can be associated with a logical address, and a controller such as controller 108 can be configured to access the appropriate mapping entry in the L2P table based on the logical address.

At block 552, the write process includes incrementing the activity counter corresponding to the determined PMUA by a write increment amount, which can be, for example, some multiple of the read increment amount. For instance, the write increment can be four times that of the read increment. As such, if the read increment is one unit, then the activity counter of the corresponding PMUA can be incremented by four units. Incrementing the activity counter can include accessing the PMUA table (e.g., 340, 440) based on the determined PMUA and updating the activity counter field (e.g., 443) of the corresponding entry (e.g., 441).

At block 553, the write process includes determining whether the activity counter corresponding to the determined PMUA has reached a disturb threshold level. The disturb threshold level can be, for example, a particular activity count value that is based on a likelihood of neighbor PMUAs having experienced disturb due to accesses (e.g., reads/writes) to the PMUA. For instance, the stored threshold voltages, stored resistance values, and/or other characteristics of the constituent memory cells corresponding to neighboring PMUAs can be changed responsive to accesses to the determined PMUA, which may be referred to as the "aggressor" PMUA. In various instances, it can be beneficial to re-write neighboring PMUAs which have experienced disturb (e.g., "neighbor disturb") due to accesses to an aggressor PMUA. Such re-writing of neighbor PMUAs can restore the desired stored data values of the neighbor PMUAs, which can reduce the bit error rate (BER), among other benefits.

As shown at block 554, if the activity counter corresponding to the determined PMUA has reached disturb threshold, then the PMUA is added to the disturb list (e.g., 333). As described further in FIG. 8, the disturb list can be accessed in association with performing a neighbor disturb mitigation process.

At block 555, the write process includes determining whether the activity counter corresponding to the determined PMUA has reached a swap threshold level. The swap threshold level can correspond to a particular activity count value at which it can be beneficial to change the logical to physical mapping associated with a PMUA (e.g., in order to more evenly spread wear amongst PMUAs). For instance, as shown at block 556, if the activity counter corresponding to the determined PMUA has reached the swap threshold, then the PMUA is added to the hot list (e.g., 334). Responsive to the activity counter corresponding to the determined PMUA reaching the swap threshold, the PMUA is also added to the disturb list (e.g., 333), and the activity counter (e.g., 443) and hot flag (e.g., 445) of the corresponding PMT entry (e.g., 441) are cleared (e.g., reset).

At block 557, the write process shown in FIG. 5 ends, which can include proceeding to write the data corresponding to the write request to the memory.

FIG. 6 is a flow diagram illustrating an example read process associated with performing memory management in accordance with a number of embodiments of the present disclosure. The read process described in FIG. 6 can be performed by, for example, a controller such as controller 108 shown in FIG. 1. The read process can be, for example, read process 332 shown in FIG. 3, and can be performed responsive to a received read request (e.g., a host read request from a host such as host 102). At block 661, the read process includes determining a PMUA from which data corresponding to the read request is to be read. Determining the PMUA can include accessing a L2P table such as MUA table 220 or 320. For example, the read request can be associated with a logical address, and a controller such as controller 108 can be configured to access the appropriate mapping entry in the L2P table based on the logical address.

At block 662, the read process includes incrementing the activity counter corresponding to the determined PMUA by the read increment amount. For instance, if the read increment is one unit, then the activity counter of the corresponding PMUA can be incremented by one. Incrementing the activity counter can include accessing the PMUA table (e.g., 340, 440) based on the determined PMUA and updating the activity counter field (e.g., 443) of the corresponding entry (e.g., 441).

At block 663, the read process includes determining whether the activity counter corresponding to the determined PMUA has reached the disturb threshold level. As shown at block 664, if the activity counter corresponding to the determined PMUA has reached the disturb threshold, then the PMUA is added to the disturb list (e.g., 333).

As shown at block 665, the method proceeds with reading the PMU (located at the determined PMUA) from the memory (e.g., 110, 210). At block 666, a bit flip count corresponding to the read data is determined (e.g., via controller 108), and the bit flip high water mark corresponding to the PMUA can be set (e.g., updated). For example, field 449 of the PMT entry 441 corresponding to the PMUA can be updated responsive to the quantity of determined bit flips exceeding a current bit flip high water mark associated with the PMUA and indicated by a current value of field 449.

At block 667, a determination is made regarding whether the bit flip high water mark has reached a quarantine threshold level. The quarantine threshold level can be a bit flip count at which a corresponding PMUA is to undergo further evaluation (e.g., to determine whether to continue to use the PMUA). If the bit flip high water mark corresponding to the PMUA has reached the quarantine threshold level, then, as shown at block 668, the PMUA is added to the quarantine list (e.g., 335) and a swap operation is performed on the PMUA. A swap operation refers to a wear leveling operation in which LMUAs corresponding to respective PMUAs of a pair of PMUAs are "swapped" with each other. The swap operation can include swapping the data stored at the respective PMUAs such that, subsequent to the swap, the data stored initially at a first of the PMUAs is stored at the second of the PMUAs and the data stored initially at the second of the PMUAs is stored at the first of the PMUAs. The swap operation can include updating the MUA L2P table to reflect the updated mappings. An example swap operation is further described below in association with the wear leveling method of FIG. 7.

Responsive to the bit flip high water mark corresponding to the PMUA having not been reached, the determined bit flip count is compared to a re-write threshold level, as shown at block 669. The re-write threshold can be a bit flip count at which it can be beneficial to re-write the data stored at a PMUA (e.g., to reduce the quantity of errors in the stored data). Therefore, as shown at block 671, the read process includes writing the PMUA (i.e., the PMUA which was read at 665) to the memory (e.g., 110, 210).

As shown at block 672, the read process includes comparing the activity count (e.g., 443) to the swap threshold. If the activity count has reached the swap threshold, then as shown at block 673, the PMUA is added to the hot list (e.g., 334), the hot flag (e.g., 445) in the corresponding PMT entry 441 is set, the PMUA is added to the disturb list (e.g., 333), the activity counter (e.g., 443) is cleared (e.g., reset to "0"), and the cold flag (e.g., 446) is cleared.

Block 670 indicates the termination of the read process shown in FIG. 6, which can include proceeding to send the data corresponding to the read request to the requesting entity (e.g., to host 102 via controller 108).

Figure 7:
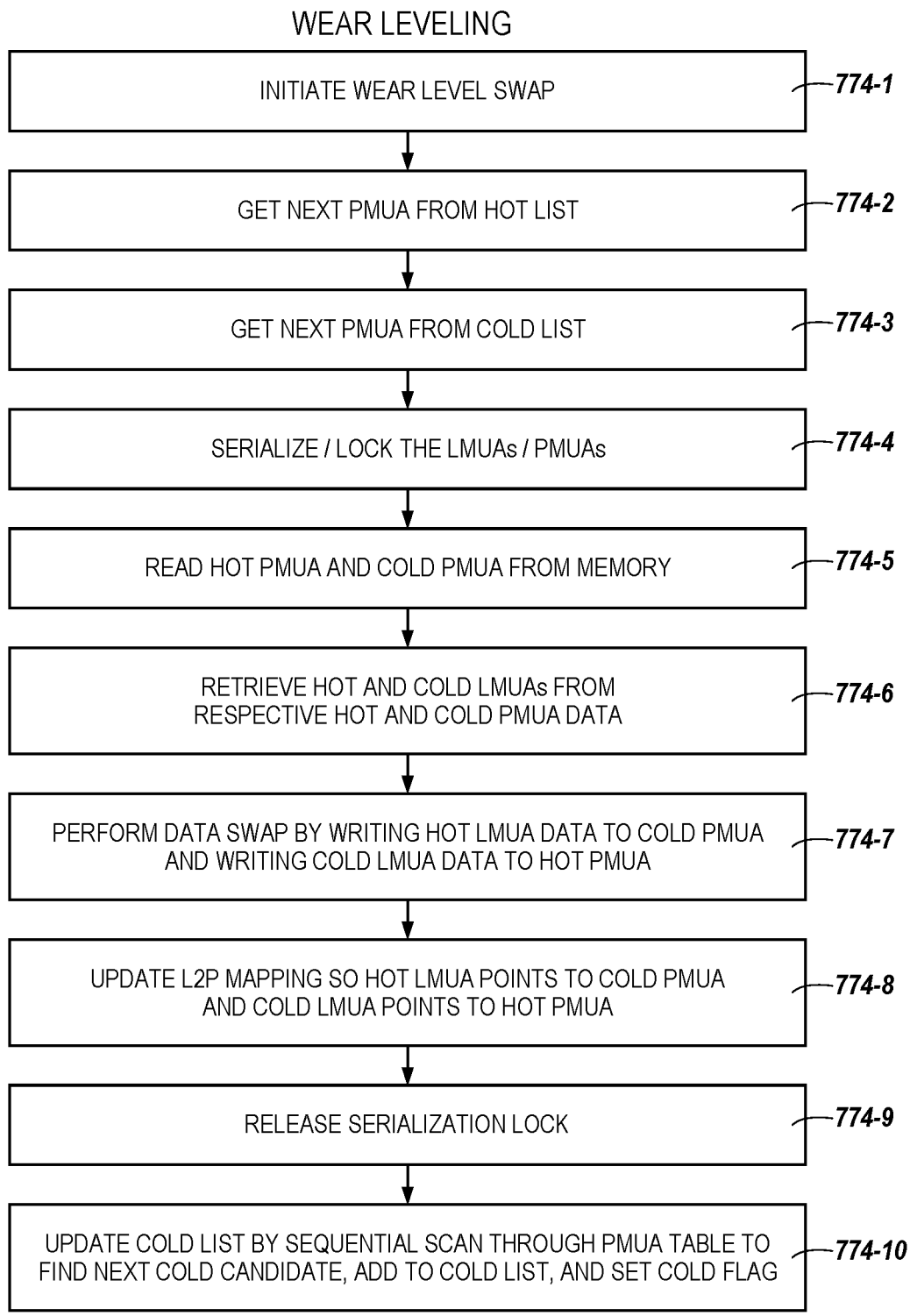
FIG. 7 is a flow diagram illustrating an example wear leveling process associated with performing memory management in accordance with a number of embodiments of the present disclosure.

FIG. 7 is a flow diagram illustrating an example wear leveling process associated with performing memory management in accordance with a number of embodiments of the present disclosure. The wear leveling process shown in FIG. 7 can correspond to wear leveling scrubber 338 shown in FIG. 3 and can be implemented via wear leveling component 112 shown in FIG. 1, for example.

The wear leveling process shown in FIG. 7 begins, at block 774-1, with the initiation of a swap operation. Although a wear leveling "swap," such as that described in FIG. 7, can be performed as a background process, a swap operation can also be performed (e.g., by wear leveling component 112) as part of a foreground process such as a host read request (e.g., as shown at 668 in FIG. 6).

At block 774-2, the process includes obtaining a next PMUA from a hot list (e.g., 334). At block 774-3, the next PMUA from the cold list (e.g., 336) is also obtained. As described above, the hot list can include, for example, PMUAs whose activity counters (e.g., value of field 443) reach a swap threshold level. The cold list can include, for example, a list of PMUAs determined to be candidates for swapping with (e.g., replacing) PMUAs having relatively higher actively counter values. For instance, the cold list can include PMUAs having corresponding activity counter values below a particular threshold, which can include spare PMUAs.

Block 774-4 establishes a serialization lock on the hot and cold LMUAs and PMUAs involved in the swap, which can result in queuing (e.g., via controller 108) of I/O requests for either of the two LMUAs until the swap is completed and the MUA L2P is updated. At block 774-5, the hot PMUA (e.g., the data stored at the PMUA obtained from the hot list) and the cold PMUA (e.g., the data stored at the PMUA obtained from the cold list) are read from the memory on which the corresponding data is stored. The data read from the hot PMUA can be referred to as the "hot data" and the data read from the cold PMUA can referred to as the "cold data." At block 774-6, the LMUAs of the respective hot and cold PMUAs are obtained (e.g., from the respective hot data and cold data read from the memory). For instance, the LMUAs which currently map to the PMUAs can be written to the memory along with other hot data and cold data corresponding to the respective hot and cold PMUAs (e.g., user data, parity data, metadata, etc.). Accordingly, the corresponding hot and cold LMUAs can be obtained from reading the respective hot and cold PMUAs.

Block 774-7 includes performing a data swap by writing the hot data (e.g., the data read from the hot PMUA and mapped by the hot LMUA) to the cold PMUA and writing the cold data (e.g., the data read from the cold PMUA and mapped by the cold PMUA) to the hot PMUA. At block 774-8, the L2P table (e.g., 220, 320) is updated such that the cold LMUA now points to the hot PMUA and the hot LMUA now points to the cold PMUA. At block 774-9, the serialization lock is released for the hot and cold LMUAs such that any queued I/O requests to those LMUAs can be executed.

At block 774-10, the wear leveling process shown in FIG. 7 includes updating the cold list (e.g., 336). The cold list can be updated by scanning (e.g., sequentially) through the PMUA table (e.g., 340, 440) to find a next cold candidate. The cold candidate can be selected based on various factors. For example, the cold candidate can be selected from among a group of spare PMUAs (e.g., PMUAs in table 340/440 whose spare flag 444 is set) and/or from among those PMUAs whose cold flag (e.g., 446) is set. The cold candidate can be selected based on the values of various other fields within the PMT entry 441. For instance, the cold candidate can be selected from among those PMUAs whose hot flag 445, quarantine flag 447, and failed flag 448 are not set, among various other factors. The selected candidate can be added to the cold list (e.g., 336) and the corresponding cold flag (e.g., 446) can be set (if not already set).

Figure 8:
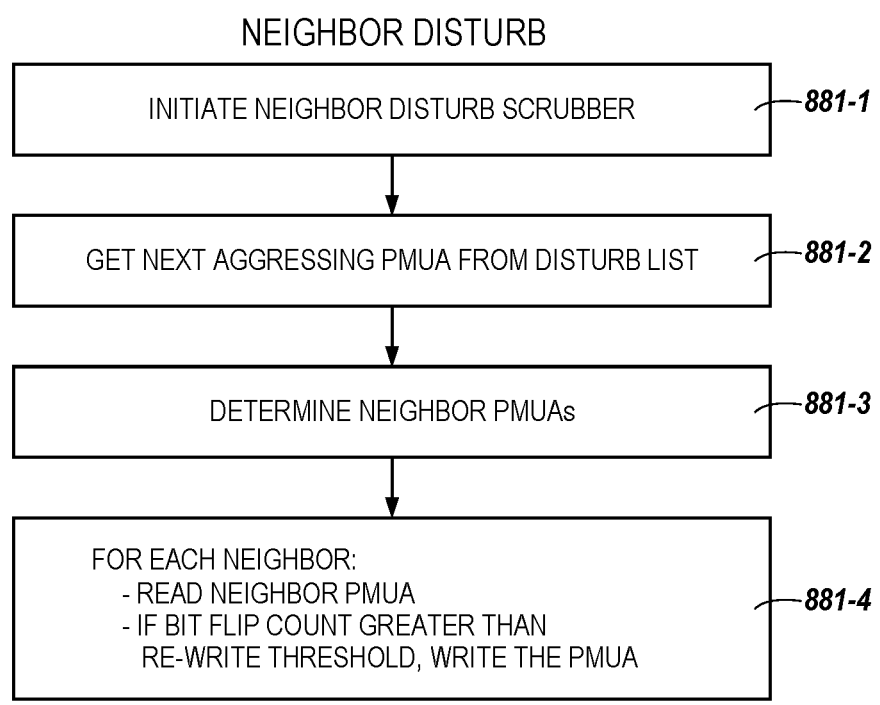
FIG. 8 is a flow diagram illustrating an example neighbor disturb mitigation process associated with performing memory management in accordance with a number of embodiments of the present disclosure.

FIG. 8 is a flow diagram illustrating an example neighbor disturb mitigation process associated with performing memory management in accordance with a number of embodiments of the present disclosure. The neighbor disturb mitigation process shown in FIG. 8 can correspond to neighbor disturb scrubber 337 shown in FIG. 3, and can be implemented via disturb component 113 shown in FIG. 1, for example.

The neighbor disturb mitigation process shown in FIG. 8 begins, at block 881-1, with the initiation of a neighbor disturb scrubber. The neighbor disturb mitigation process described in FIG. 8 can be performed as a background process; however, embodiments are not so limited. As shown at block 881-2, the neighbor disturb mitigation process includes obtaining a next PMUA from the disturb list (e.g., 333). As described above, the disturb list can include PMUAs determined to be "aggressors," with neighboring PMUAS, which may have experienced disturb effects, being "victims." At block 881-3, the neighbor PMUAs (e.g., the victim PMUAs physically adjacent to the aggressor PMUA) are determined.

As illustrated at block 881-4, the disturb process includes, for each neighbor PMUA, reading the PMUA from the memory (e.g., 110, 210), determining a bit flip count of the read data corresponding to the PMUA, and determining whether to re-write the PMUA. Determining whether to re-write the PMUA can include comparing the determined bit flip count to a re-write threshold level such as that described above in association with FIG. 6 (e.g., at 669). If the bit flip count of the read PMUA data is greater than the re-write threshold, the neighbor disturb process proceeds with re-writing the neighbor PMUA.

Figure 9:
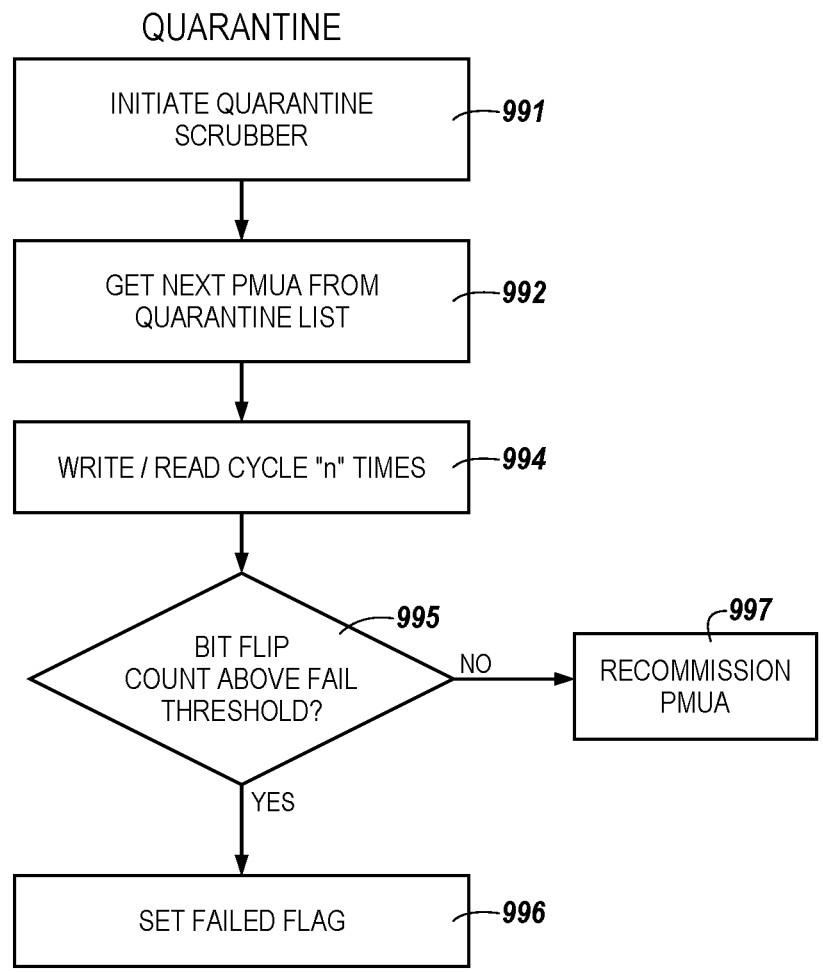
FIG. 9 is a flow diagram illustrating an example quarantine process associated with performing memory management in accordance with a number of embodiments of the present disclosure.

FIG. 9 is a flow diagram illustrating an example quarantine process associated with performing memory management in accordance with a number of embodiments of the present disclosure. The quarantine process shown in FIG. 9 can correspond to quarantine scrubber 339 shown in FIG. 3, and can be implemented via memory management component 111 shown in FIG. 1, for example.

At block 991, the quarantine scrubbing operation is initiated. At block 992, the next PMUA from the quarantine list (e.g., 335) is obtained. At block 994, the PMUA is write/read cycled "n" times, and at block 995 a determined bit flip count is compared to a fail threshold. The fail threshold can be a quantity of bit flips above which the PMUA can be retired from further use due to being considered too unreliable, for example.

The bit flip count to be compared to the fail threshold can be determined in a various ways. For instance, for each of the "n" reads, the respective bit flip count can be determined and compared to the fail threshold. Or, an average bit flip count of the "n" reads can be determined, and the average compared to the fail threshold. Alternatively, a single bit flip count for the PMUA can be determined after the "nth" cycle.

If the determined bit flip count corresponding to the PMUA is not above the fail threshold, then the PMUA can be recommissioned, as shown at 997. Recommissioning the PMUA can include removing the PMUA from the quarantine list and clearing the quarantine flag in the corresponding PMT table entry. If the determined bit flip count corresponding to the PMUA is above the fail threshold, then as shown at 996, the failed flag (e.g., 448) in the corresponding PMT table entry can be set and the PMUA can be considered retired.

In various instances, the methods described in FIGS. 5-9 can be implemented together in association with performing memory management in accordance with embodiments of the present disclosure. For instance, execution of the methods can employ various data structures such as those shown in FIGS. 1-4 in a manner which provides an integrated process for performing wear leveling while handling neighbor disturb mitigation, which can provide improved system operation as compared to prior approaches. For example, embodiments of the present disclosure can be flexible and adaptive to changes in memory characteristics such as life-cycle wear and neighbor disturb effects, which can vary over time. For instance, in a number of embodiments, the various threshold levels (e.g., disturb threshold, swap threshold, quarantine threshold, rewrite threshold, etc.) can be adjusted based on factors such as the age of the system and/or workload level experienced by the system, among various other factors.

Figure 10:
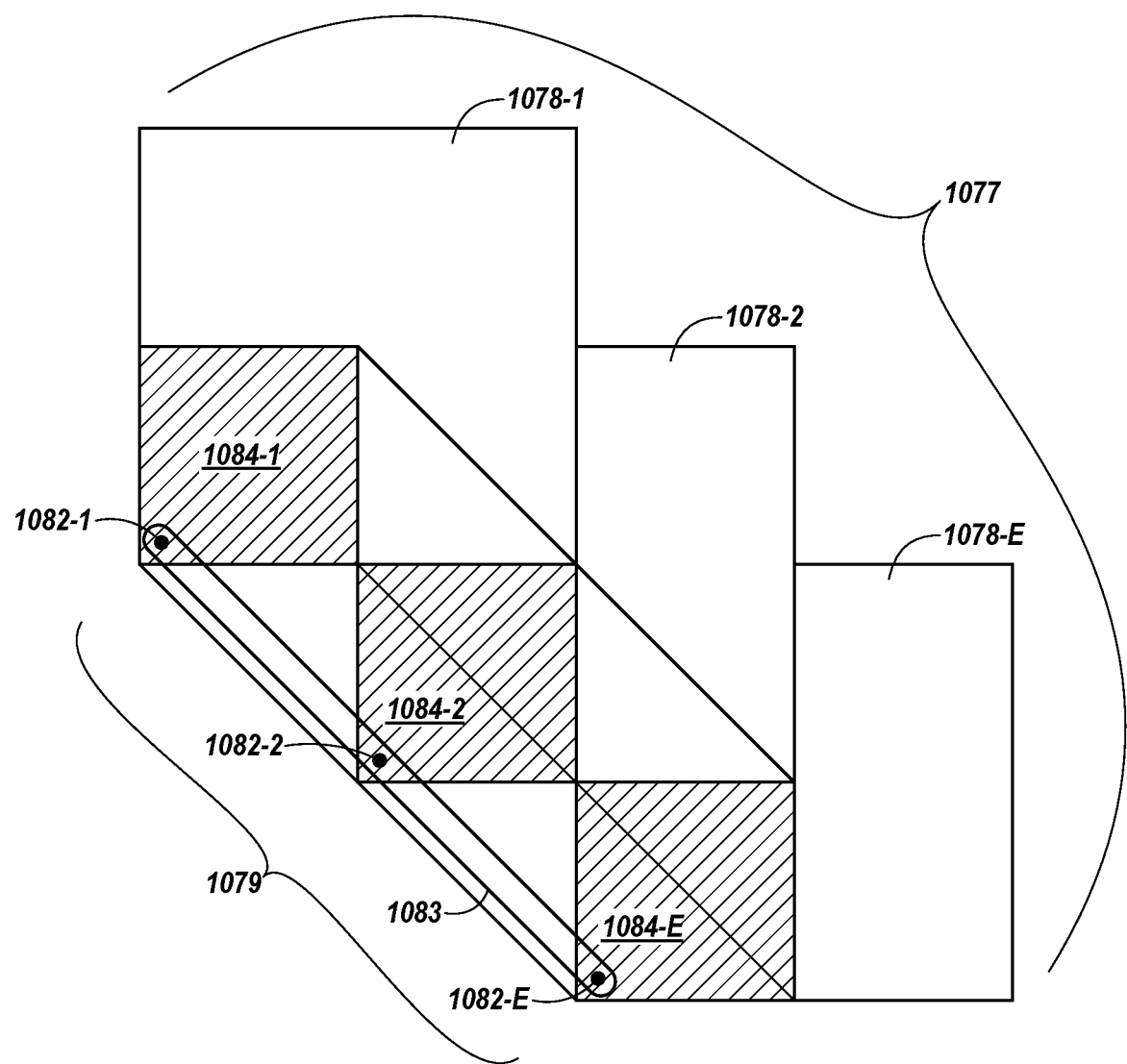
FIG. 10 is a block diagram illustrating a portion of a memory device on which memory management can be performed in accordance with a number of embodiments of the present disclosure.

FIG. 10 is a block diagram illustrating a portion of a memory device on which memory management can be performed in accordance with a number of embodiments of the present disclosure. The memory device can be analogous to the memory devices 110 illustrated in FIG. 1. The memory device can include a number of three-dimensional memory entities 1077. The three-dimensional memory entity can include multiple two-dimensional memory entities 1078-1, 1078-2, . . . , 1078-E. The two-dimensional memory entities 1078 can be arrays of memory cells 1082-1, 1082-2, . . . , 1082-E. In FIG. 10, only one of the memory cell 1082 is illustrated for each respective two-dimensional memory entity 1078. The two-dimensional memory entities are referred to as being two-dimensional because they are of a lesser dimension than the three-dimensional memory entity 1077. For instance, even though they are three-dimensional physical objects, they are referred to as being two-dimensional because a group of two-dimensional memory entities 1078 can form a memory entity of a higher dimension, which is referred to as a three-dimensional memory entity 1077. The two-dimensional memory entities 1078 can include more than one planar array of memory cells.

The two-dimensional memory entities 1078 are referred to as being two-dimensional because they are of a greater dimension than the memory cells 1082, which individually can be referred to as one-dimensional memory elements (again, even though they exist as three-dimensional physical objects). A grouping of a multiple three-dimensional memory elements 1077 can be referred to as a four-dimensional memory element (not specifically illustrated in FIG. 10). A grouping of a multiple of four-dimensional memory elements can be referred to as a five-dimensional memory element, etc.

In operation, a controller (e.g., 108) can be configured to read data from and/or write data to the memory device at a resolution 1083, which may be referred to as a page size 1083. As described above, in a number of embodiments, the controller can manage the memory device via managed units (MUs), which may correspond to a multiple of the page size 1083.

The controller can be configured to collect error rate information from the memory device shown in FIG. 10 at a second resolution 1084. FIG. 10 includes an illustration of a respective example of the second resolution 1084-1, 1084-2, . . . , 1084-E for each of the two-dimensional memory elements 1078. In a number of embodiment, error information can be collected at the second resolution 1084.

As an example, the memory device shown in FIG. 10 can be 3D cross-point array of resistance variable memory cells (e.g., phase change memory cells, SSM cells, and/or other chalcogenide based memory cells). For instance, in the case of various 3D cross-point memories, the two-dimensional memory entities 1078 can be tiles, the three dimensional memory entities 1077 can be slices, the portion 1079 of the three-dimensional memory entity 1077 can be a sub-slice, and the portions of the two-dimensional memory entities 1078 corresponding to the second resolution 1041 can be sub-tiles.

Figure 11:
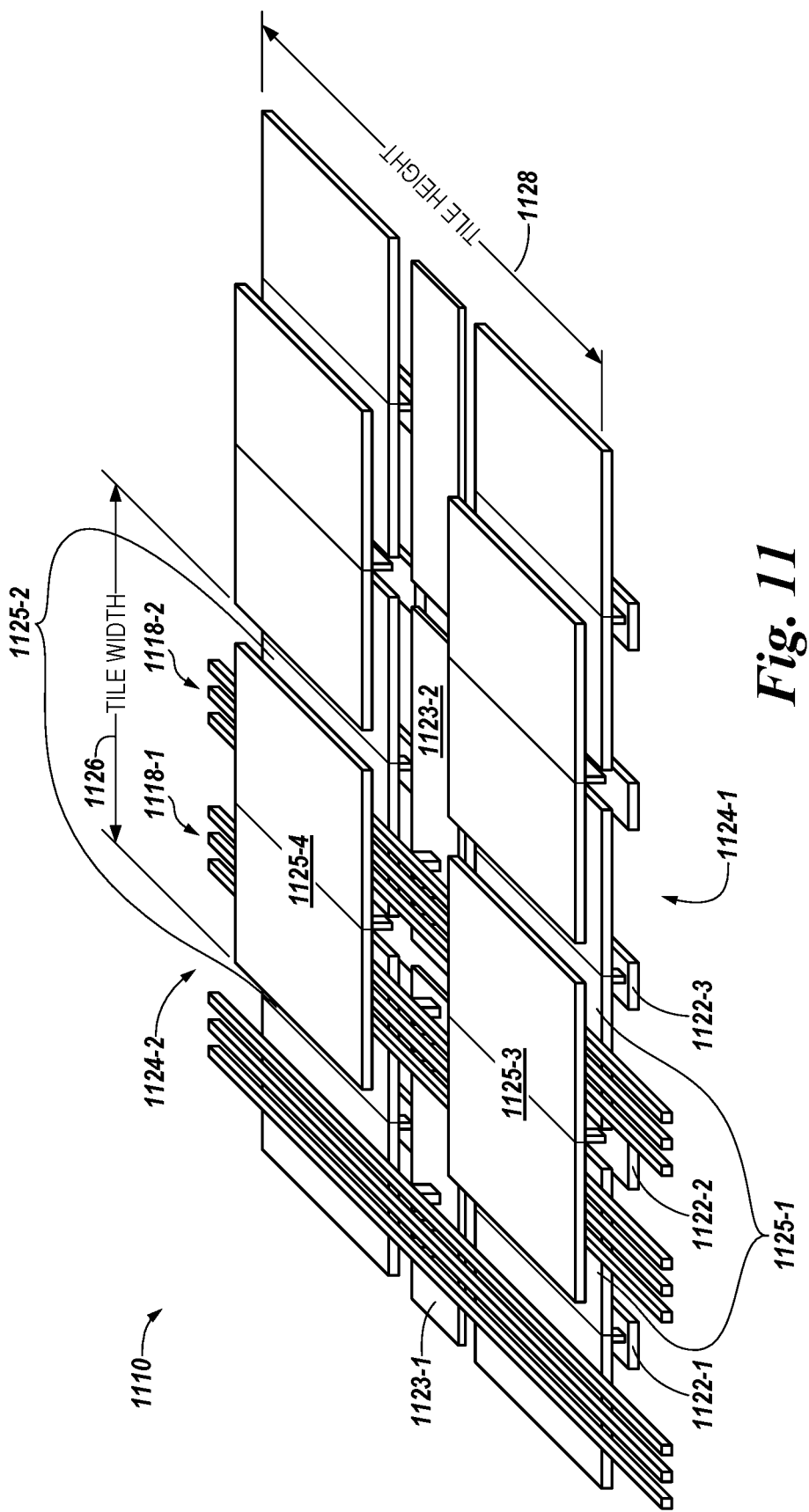
FIG. 11 is another block diagram illustrating a portion of a memory device on which memory management can be performed in accordance with a number of embodiments of the present disclosure.

FIG. 11 is another block diagram illustrating a portion of a memory device 1110 on which memory management can be performed in accordance with a number of embodiments of the present disclosure. The memory device 1110 can be analogous to the memory devices 110 illustrated in FIG. 1 and the memory device portion shown in FIG. 10. As an example, the memory device 310 can be a 3D Phase Change Material and Switch (PCMS) memory device. A 3D PCMS device can include memory cells having a "stack" structure including a switch element and a storage element formed between conductive lines (e.g., word lines and bit lines).

The memory device 1110 includes multiple two-dimensional memory elements, which are referred to as tiles. The tiles can include more than one deck (e.g., such as a lower deck 1124-1 and an upper deck 1124-2 as illustrated) of memory cells in an array. The tiles can have a width 1126 and a height 1128. The tiles can be divided into sub-tiles 1125-1, 1125-2, 1125-3, 1125-4. In some embodiments, the sub-tiles can be quarters of a tile.

Each memory cell (not specifically illustrated) can be addressed by a word line and bit line combination. By way of example, a tile can include 2048 bit lines 1118-1, 1118-2 and 4096 word lines per deck. However, memory devices 1110 are not limited to a particular number of word lines and/or bit lines 318. The word lines can be coupled to word line decoders (e.g., 1122-1, 1122-2, 1122-3). The bit lines can be coupled to bit line decoders (e.g., 1120-1, 1120-2). The word line decoders 1122 and the bit line decoders 1120 can be coupled to a controller (not specifically illustrated) such as controller 108 illustrated in FIG. 1. Embodiments of the present disclosure are not limited to the device structure illustrated in FIG. 11.

Figure 12:
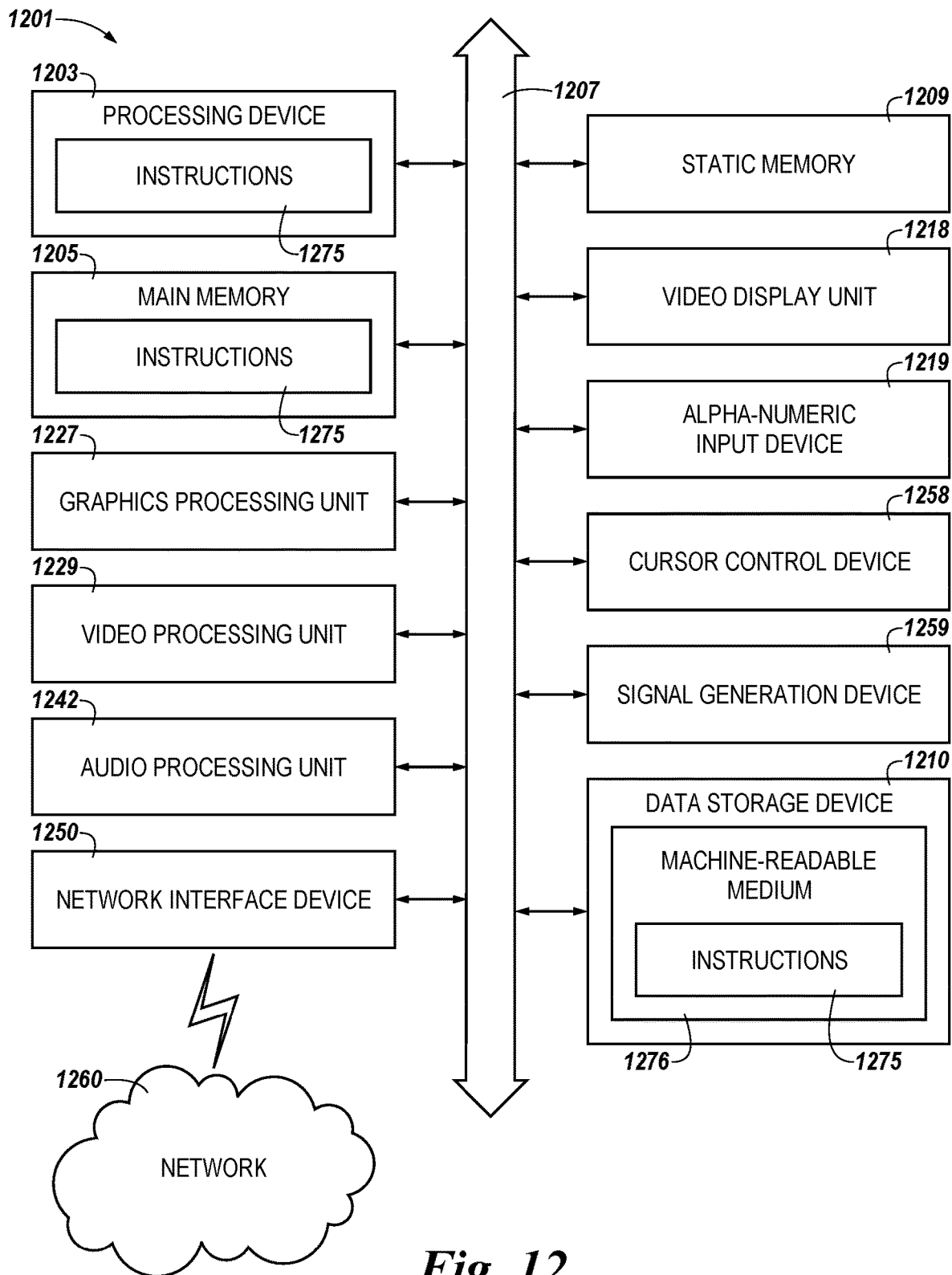
FIG. 12 is a block diagram of an example apparatus in the form of a computer system in which implementations of the present disclosure may operate.

FIG. 12 is a block diagram of an example apparatus in the form of a computer system 1201 in which implementations of the present disclosure may operate. For example, the computer system 1201 may include or utilize a memory system such as memory system 104 of FIG. 1 (e.g., an SSD). System 1201 can also be a system such as computing system 100 shown in FIG. 1. The system 1201 can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1201 includes a processing device 1203, a main memory 1205 (e.g., read-only memory (ROM), flash memory, dynamic random access memory (DRAM) such as synchronous DRAM (SDRAM) or Rambus DRAM (RDRAM), etc.), a static memory 1209 (e.g., flash memory, static random access memory (SRAM), etc.), and a data storage device 1210, which communicate with each other via a bus 1207.

Processing device 1203 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 1203 can also be one or more special-purpose processing devices such as an application specific integrated circuit (ASIC), a field programmable gate array (FPGA), a digital signal processor (DSP), network processor, or the like. The processing device 1203 is configured to execute instructions 1275 for performing the operations and steps discussed herein.

The computer system 1201 can further include a network interface device 1250 to communicate over the network 1260. The computer system 1201 also can include a video display unit 1218 (e.g., a liquid crystal display (LCD) or a cathode ray tube (CRT)), an alphanumeric input device 1219 (e.g., a keyboard), a cursor control device 1258 (e.g., a mouse), a signal generation device 1259 (e.g., a speaker), graphics processing unit 1227, video processing unit 1229, and audio processing unit 1242.

The data storage device 1210 can include a machine-readable storage medium 1276 (also referred to as a computer-readable medium) on which is stored one or more sets of instructions 1275 (e.g., software) embodying one or more of the various methodologies or functions described herein. The instructions 1275 can also reside, completely or at least partially, within the main memory 1205 and/or within the processing device 1203 during execution thereof by the computer system 1201, the main memory 1205 and the processing device 1203 also constituting machine-readable storage media. The machine-readable storage medium 1276, data storage device 1210, and/or main memory 1205 can correspond to the memory system 104 of FIG. 1.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that can include a machine-readable medium having stored thereon instructions, which may be used to program a computer system (or other electronic devices) to perform a process according to the present disclosure.

As used herein, "a" or "an" can refer to one or more of something, and "a plurality" of can refer to more than one of such things. For example, a memory cell can refer to one or more memory cells, and a plurality of memory cells can refer to two or more memory cells. Additionally, the designators "E", "P", and "N", as used herein, particularly with respect to reference numerals in the drawings, indicates that one or more of the particular feature so designated can be included with an embodiment of the present disclosure.

The figures herein follow a numbering convention in which the first digit or digits correspond to the drawing figure number and the remaining digits identify an element or component in the drawing. Similar elements or components between different figures may be identified by the use of similar digits. For example, "340" can reference element "40" in FIG. 3, and a similar element can be references as "440" in FIG. 4.

Various methods of the present disclosure, such as the methods described in FIGS. 5-9, can be performed by processing logic in the form of hardware (e.g., a processing device such as a processor, control circuitry, dedicated logic, programmable logic, integrated circuits, etc.) and/or software (e.g., instructions, which can include firmware, and which can be executed by a processing device), and/or or a combination thereof.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for memory management, comprising:
maintaining a first data structure comprising logical address to physical address mappings for managed units corresponding to a memory;
maintaining a second data structure whose entries correspond to respective physical managed unit addresses, wherein each entry of the second data structure comprises:
an activity counter field corresponding to the respective physical managed unit address; and
a number of additional fields indicating whether the respective physical managed unit address is in one or more of a number of additional data structures that are accessed in association with performing at least one of:
a wear leveling operation on the respective physical managed unit address; and
a neighbor disturb mitigation operation on physical managed unit addresses corresponding to neighbors of the respective physical managed unit address; and
performing a write operation to the memory, wherein performing the write operation to the memory comprises:
accessing the first data structure to determine a particular physical managed unit address to which a logical managed unit address is mapped;
accessing the second data structure based on the determined particular physical managed unit address;
incrementing a value of the activity counter field of the entry in the second data structure corresponding to the particular physical managed unit address;
adding the particular physical managed unit address to a first of the number of additional data structures responsive to determining the value of the activity counter field has reached a disturb threshold; and
adding the particular physical managed unit address to the first and a second of the number of additional data structures responsive to determining the value of the activity counter field has reached a swap threshold.

2. The method of claim 1, wherein the method includes updating the value of the activity counter field responsive to write operations and responsive to read operations performed on the physical managed unit corresponding to the respective physical managed unit address.

3. The method of claim 2, wherein updating the value of the activity counter field further comprises incrementing the value of the activity counter field by a first amount for reads and by a different amount for writes.

4. The method of claim 1, wherein the method comprises accessing both the first data structure and the second data structure for each host read request and for each host write request received by a controller configured to maintain the first data structure and the second data structure.

5. The method of claim 1, wherein performing the write operation further comprises, subsequently to adding the particular physical managed unit address to the first and the second of the number of additional data structures responsive to determining the value of the activity counter field has reached a swap threshold:
resetting the activity counter field in the entry of the second data structure corresponding to the particular physical managed unit address; and
updating a first and a second of the number of additional fields in the entry of the second data structure corresponding to the particular physical managed unit address.

6. The method of claim 1, wherein performing a read operation from the memory comprises:
accessing the first data structure to determine a particular physical managed unit address to which a logical managed unit address is mapped;
accessing the second data structure based on the determined particular physical managed unit address;
incrementing the value of the activity counter field of the entry in the second data structure corresponding to the particular physical managed unit address;
adding the particular physical managed unit address to a first of the number of additional data structures responsive to determining the value of the activity counter field has reached a disturb threshold; and
reading, from the memory, data stored in memory cells corresponding to the determined particular physical managed unit address.

7. The method of claim 6, wherein performing the read operation further comprises:
determining a bit flip count corresponding to the read data stored in the memory cells corresponding to the determined particular physical managed unit address;
rewriting the particular physical managed unit address responsive to determining the bit flip count has reached a rewrite threshold;
responsive to determining the value of the activity counter field has reached a quarantine threshold:
adding the particular physical managed unit address to a second of the number of additional data structures; and
performing a swap operation on the particular physical managed unit address.

8. The method of claim 6, wherein performing the read operation further comprises, responsive to determining the value of the activity counter field has reached a swap threshold:
adding the particular physical managed unit address to the first and a third of the number of additional data structures;
resetting the activity counter field in the entry of the second data structure corresponding to the particular physical managed unit address; and
in the entry of the second data structure corresponding to the particular physical managed unit address, updating a first of the number of additional fields corresponding to the third of the number of additional data structures, and updating a second of the number of additional fields corresponding to a fourth of the number of additional data structures.

9. The method of claim 1, wherein the number of additional data structures comprise a third data structure and a fourth data structure, and wherein the method further comprises performing a wear level swap by:
obtaining a first physical managed unit address from the third data structure;
obtaining a second physical managed unit address from the fourth data structure;
reading the physical managed units corresponding to the respective first and second physical managed unit addresses;

determining, from data read from the physical managed units, logical managed unit addresses corresponding to the respective first and second physical managed unit addresses;

performing a data swap that comprises:
- writing the data read from the physical managed unit corresponding to the first physical managed unit address to the physical managed unit corresponding to the second physical managed unit address; and
- writing the data read from the physical managed unit corresponding to the second physical managed unit address to the physical managed unit corresponding to the first physical managed unit address; and updating the logical address to physical address mappings of the first data structure such that the logical managed unit address previously mapping to the first physical managed unit address now maps to the second physical managed unit address and such that the logical managed unit address previously mapping to the second physical managed unit address now maps to the first physical managed unit address.

10. The method of claim 9, wherein the wear level swap in performed as a background operation and further comprises:
- scanning the second data structure to determine a next physical managed unit address to add to the fourth data structure based on the values of the activity counter fields of the respective second data structure entries corresponding to the physical managed unit addresses;
- adding the determined next physical managed unit address to the fourth data structure; and
- setting, in the second data structure entry corresponding to the determined next physical managed unit address, an indicator that the determined next physical managed unit address is in the fourth data structure.

11. The method of claim 1, wherein the number of additional data structures comprises a third data structure whose entries indicate those physical managed unit addresses whose corresponding entries in the second data structure include activity counter values above a disturb threshold level, and wherein the method further comprises performing a neighbor disturb mitigation operation by:
- obtaining a physical managed unit address from the third data structure;
- determining a number of physical managed unit addresses corresponding to neighbors of the physical managed unit address; and
- for each of the number of determined neighbor physical managed unit addresses:
  - reading, from the memory, the neighbor physical managed unit corresponding to the determined neighbor physical managed unit address;
  - determining a bit flip count corresponding to the data read from the determined neighbor physical managed unit; and
  - responsive to the determined bit flip count being above a rewrite threshold, rewriting the determined neighbor physical managed unit.

12. The method of claim 1, wherein the number of additional data structures comprises a third data structure whose entries indicate those physical managed unit addresses whose corresponding entries in the second data structure include bit flip count field values above a quarantine threshold level, and wherein the method further comprises performing a wear out test operation by:
- obtaining a physical managed unit address from the third data structure;
- determining a number of physical managed unit addresses corresponding to neighbors of the physical managed unit address; and
- reading and writing the physical managed unit a number of times and determining a bit flip count corresponding to the physical managed unit for each respective read;
- responsive to the determined bit flip count reaching a fail threshold, setting, in the second data structure entry corresponding to the physical managed unit address, an indicator that the physical managed unit failed the wear out test operation;
- responsive to the determined bit flip count not reaching the fail threshold, removing the physical managed unit address from the third data structure such that the corresponding physical managed unit may be reused.

13. The method of claim 1, wherein the memory comprises a write in place memory, and wherein the method further comprises performing a number of host write requests, with the number of write requests being completed without resulting in updates to the first data structure.

14. An apparatus, comprising
a number of memory devices; and
a processing device configured to:
- maintain a first data structure comprising logical address to physical address mappings for managed units corresponding to the number of memory devices;
- maintain a second data structure whose entries correspond to respective physical managed unit addresses, wherein each entry of the second data structure comprises:
  - an activity counter field corresponding to the respective physical managed unit address; and
  - a number of additional fields indicating whether the respective physical managed unit address is in one or more of a number of additional data structures that are accessed in association with performing at least one of:
    - a wear leveling operation on the respective physical managed unit address; and
    - a neighbor disturb mitigation operation on physical managed unit addresses corresponding to neighbors of the respective physical managed unit address;
- access the first data structure to determine a particular physical managed unit address to which a logical managed unit address is mapped;
- access the second data structure based on the determined particular physical managed unit address;
- increment the value of the activity counter field of the entry in the second data structure corresponding to the particular physical managed unit address;
- add the particular physical managed unit address to a first of the number of additional data structures responsive to determining the value of the activity counter field has reached a disturb threshold; and
- add the particular physical managed unit address to the first and a second of the number of additional data structures responsive to determining the value of the activity counter field has reached a swap threshold.

15. The apparatus of claim 14, wherein the apparatus comprises:
- a memory system comprising the number of memory devices and the processing device; and
- a host coupled to the memory system and configured to provide requests to the memory system via an interface.

16. The apparatus of claim 14, wherein the processing device is configured to access the first data structure to determine which entry of the second data structure to access in association with executing the requests.

17. The apparatus of claim 14, wherein the processing device is configured to:
  access the first data structure to determine a particular physical managed unit address to which a logical managed unit address is mapped;
  access the second data structure based on the determined particular physical managed unit address;
  increment the value of the activity counter field of the entry in the second data structure corresponding to the particular physical managed unit address;
  add the particular physical managed unit address to a first of the number of additional data structures responsive to determining the value of the activity counter field has reached a disturb threshold; and
  read, from the memory devices, data stored in memory cells corresponding to the determined particular physical managed unit address.

18. The apparatus of claim 14, wherein the number of additional data structures comprises a third data structure whose entries indicate those physical managed unit addresses whose corresponding entries in the second data structure include activity counter values above a disturb threshold level, and wherein the processing device is configured to perform a neighbor disturb mitigation operation by:
  obtaining a physical managed unit address from the third data structure;
  determining a number of physical managed unit addresses corresponding to neighbors of the physical managed unit address; and
  for each of the number of determined neighbor physical managed unit addresses:
    reading, from the memory devices, the neighbor physical managed unit corresponding to the determined neighbor physical managed unit address;
    determining a bit flip count corresponding to the data read from the determined neighbor physical managed unit; and
    responsive to the determined bit flip count being above a rewrite threshold, rewriting the determined neighbor physical managed unit.

19. A method for memory management, comprising:
  maintaining a first data structure comprising logical address to physical address mappings for managed units corresponding to a memory;
  maintaining a second data structure whose entries correspond to respective physical managed unit addresses, wherein each entry of the second data structure comprises:
    an activity counter field corresponding to the respective physical managed unit address; and
    a number of additional fields indicating whether the respective physical managed unit address is in one or more of a number of additional data structures that are accessed in association with performing at least one of:
      a wear leveling operation on the respective physical managed unit address; and
      a neighbor disturb mitigation operation on physical managed unit addresses corresponding to neighbors of the respective physical managed unit address; and
  performing a read operation from the memory, wherein performing the read operation from the memory comprises:
    accessing the first data structure to determine a particular physical managed unit address to which a logical managed unit address is mapped;
    accessing the second data structure based on the determined particular physical managed unit address;
    incrementing a value of the activity counter field of the entry in the second data structure corresponding to the particular physical managed unit address;
    adding the particular physical managed unit address to a first of the number of additional data structures responsive to determining the value of the activity counter field has reached a disturb threshold;
    reading, from the memory, data stored in memory cells corresponding to the determined particular physical managed unit address;
    responsive to determining the value of the activity counter field has reached a swap threshold:
      adding the particular physical managed unit address to the first and a third of the number of additional data structures;
      resetting the activity counter field in the entry of the second data structure corresponding to the particular physical managed unit address; and
      in the entry of the second data structure corresponding to the particular physical managed unit address, updating a first of the number of additional fields corresponding to the third of the number of additional data structures, and updating a second of the number of additional fields corresponding to a fourth of the number of additional data structures.

20. A method for memory management, comprising:
  maintaining a first data structure comprising logical address to physical address mappings for managed units corresponding to a memory;
  maintaining a second data structure whose entries correspond to respective physical managed unit addresses, wherein each entry of the second data structure comprises:
    an activity counter field corresponding to the respective physical managed unit address; and
    a number of additional fields indicating whether the respective physical managed unit address is in one or more of a number of additional data structures that are accessed in association with performing at least one of:
      a wear leveling operation on the respective physical managed unit address; and
      a neighbor disturb mitigation operation on physical managed unit addresses corresponding to neighbors of the respective physical managed unit address; and
  wherein the number of additional data structures comprises a third data structure whose entries indicate those physical managed unit addresses whose corresponding entries in the second data structure include activity counter values above a disturb threshold level, and wherein the method further comprises performing a neighbor disturb mitigation operation by:
    obtaining a physical managed unit address from the third data structure;
    determining a number of physical managed unit addresses corresponding to neighbors of the physical managed unit address; and for each of the number of determined neighbor physical managed unit addresses:
  reading, from the memory, the neighbor physical managed unit corresponding to the determined neighbor physical managed unit address;
  determining a bit flip count corresponding to the data read from the determined neighbor physical managed unit; and
  responsive to the determined bit flip count being above a rewrite threshold, rewriting the determined neighbor physical managed unit.

21. An apparatus, comprising:
a number of memory devices; and
a processing device configured to:
  maintain a first data structure comprising logical address to physical address mappings for managed units corresponding to the number of memory devices;
  maintain a second data structure whose entries correspond to respective physical managed unit addresses, wherein each entry of the second data structure comprises:
    an activity counter field corresponding to the respective physical managed unit address; and
    a number of additional fields indicating whether the respective physical managed unit address is in one or more of a number of additional data structures that are accessed in association with performing at least one of:
      a wear leveling operation on the respective physical managed unit address; and
      a neighbor disturb mitigation operation on physical managed unit addresses corresponding to neighbors of the respective physical managed unit address;
  wherein the number of additional data structures comprises a third data structure whose entries indicate those physical managed unit addresses whose corresponding entries in the second data structure include activity counter values above a disturb threshold level, and wherein the processing device is configured to perform a neighbor disturb mitigation operation by:
    obtaining a physical managed unit address from the third data structure;
    determining a number of physical managed unit addresses corresponding to neighbors of the physical managed unit address; and
    for each of the number of determined neighbor physical managed unit addresses:
      reading, from the memory devices, the neighbor physical managed unit corresponding to the determined neighbor physical managed unit address;
      determining a bit flip count corresponding to the data read from the determined neighbor physical managed unit; and
      responsive to the determined bit flip count being above a rewrite threshold, rewriting the determined neighbor physical managed unit.

* * * * *